United States Patent [19]

Yang et al.

[11] Patent Number: 5,589,411
[45] Date of Patent: Dec. 31, 1996

[54] PROCESS FOR FABRICATING A HIGH-VOLTAGE MOSFET

[75] Inventors: Sheng-Hsing Yang, Hsinchu; Shing-Ren Sheu, Taoyuan, both of Taiwan

[73] Assignee: United Microelectronics Corporation, Hsinchu, Taiwan

[21] Appl. No.: 508,515

[22] Filed: Jul. 28, 1995

[51] Int. Cl.$^6$ ................................................. H01L 21/265
[52] U.S. Cl. .................................................. 437/41; 437/44
[58] Field of Search ................................. 437/29, 40 DM, 437/40 RG, 41 DM, 41 JF, 41 RG, 203, 911, 41 ES, 44

[56] References Cited

U.S. PATENT DOCUMENTS

| | | | |
|---|---|---|---|
| 4,543,706 | 10/1985 | Bencuya et al. | 437/203 |
| 5,385,852 | 1/1995 | Oppermann et al. | 437/203 |

Primary Examiner—Mary Wilczewski
Assistant Examiner—Brian K. Dutton
Attorney, Agent, or Firm—Townsend and Townsend and Crew LLP

[57] ABSTRACT

A process for fabricating high-voltage MOSFET devices on a semiconductor substrate is disclosed. The substrate has heavily-doped impurities of a first conductivity type, and constitutes the drain region for the MOSFET. The process of fabrication comprises the steps of subsequently forming on the substrate a first doped layer, a second doped layer, a third doped layer and a shielding layer. All of these doped layers are of the first conductivity type. The second doped layer has an impurity concentration and a thickness smaller and larger than the impurity concentration and thickness respectively of the first doped layer, and larger and smaller than the impurity concentration and thickness respectively of the third doped layer. The impurity concentration of the first doped layer is smaller than the impurity concentration of the substrate. An opening in the shielding layer is formed, and then the source region of the MOSFET is formed in the area exposed by the opening. Afterwards, thermal oxidation is performed to form a field oxide layer over the surface of the source region. Next, an etching process is performed to remove the third doped layer, thereby revealing the surface of said second doped layer to form a source protruding body. Sidewalls of the source protruding body is then covered by an insulating layer. Finally, the field oxide layer and the insulating layer are then utilized as masking for implanting impurities of a second conductivity type into the second doped layer, thereby forming the gate region for the MOSFET.

7 Claims, 4 Drawing Sheets

PROCESS FOR FABRICATING A HIGH-VOLTAGE MOSFET

BACKGROUND OF THE INVENTION

1. Field of the Invention

The present invention relates in general to a process for fabricating high voltage metal-oxide semiconductor field-effect transistor (MOSFET) devices. In particular, the present invention relates to a process for fabricating high-voltage MOSFET devices having increased breakdown voltage and decreased device die surface area requirement.

2. Technical Background

One of the operating characteristics of MOSFET devices is the breakdown voltage. Conventional MOSFET devices compromise the breakdown voltage with the device semiconductor physical dimensions. In other words, to optimize the acceptable breakdown voltage for a particular MOSFET design, the physical dimension of the device has to be enlarged. A large MOSFET dimension, however, goes against the requirements of device miniaturization. A brief review of the semiconductor structural configuration of a conventional MOSFET device helps to clarify this phenomenon.

FIG. 1 schematically shows the cross-sectional view of a conventional MOSFET. As seen in the drawing, the typical MOSFET comprises an $N^+$ drain region 110 located below the $N^-$ drift region 120 in the substrate of the device. P-type well 130 is formed at the designated locations of the substrate into the predetermined depth within the confinement of the drift region 120. Each of the $N^+$ source regions 140 is formed within the confinement of the respective P-type well 130. A gate oxide layer 150 is then formed on the surface of the device substrate and straddles the space between the two separated $N^+$ source regions 140. The gate 160 further atop the gate oxide layer 150, and both the $N^+$ source regions 140 and P-channel 130 are brought into external contact by the contact metals 170. Insulating layers 180 further confine-the edges of the contact metals 170 at both sides of the MOSFET device. Arrows identified by the symbol $I_e$ indicate the flow of electrons in the MOSFET device, starting in the $N^+$ source regions 140 via the P-type well 130 and into the $N^+$ drain region 110.

Such a configuration for the MOSFET device has its $N^+$ source regions 140, P-type well 130, and portions of the $N^-$ drift region 120 arranged in the same horizontal plane, which has an expanded die area for the device. An expanded device surface area implies a reduced device density when the device is fabricated on a semiconductor substrate. On the other hand, due to the fact that there is only a portion of the $N^-$ drift region 120 that is placed under the gate 160 as spaced apart via the gate oxide layer 150, the device breakdown voltage is therefore constrained.

SUMMARY OF THE INVENTION

It is therefore an object of the present invention to provide a process for fabricating a high-voltage MOSFET having increased breakdown voltage.

It is another object of the present invention to provide a process for fabricating a high-voltage MOSFET having increased breakdown voltage while requiring a reduced die area.

The present invention achieves the above-identified objects by providing a process for fabricating high-voltage MOSFET devices on a semiconductor substrate. The substrate has heavily-doped impurities of a first type, and constitutes the drain region for the MOSFET. The process of fabrication comprises the steps of subsequently forming on the substrate a first doped layer of the first type, a second doped layer of the first type, a third doped layer of the first type and a shielding layer. The second doped layer of the first type has an impurity concentration and a thickness smaller and larger than the impurity concentration and thickness respectively of the first doped layer of the first type, and larger and smaller than the impurity concentration and thickness respectively of the third doped layer of the first type. The impurity concentration of the first doped layer of the first type is smaller than the impurity concentration of the substrate. An opening in the shielding layer is formed for defining the source region for the MOSFET. The shielding layer is then utilized as shielding mask for implanting impurities of the first type into the third doped layer of the first type in the area exposed by the opening, so as to form the source region of the MOSFET. The shielding layer is then utilized as shielding mask for performing a thermal oxidation process that forms a field oxide layer over the surface of the source region. The field oxide layer is then utilized as shielding mask for performing an etching process for removing the third doped layer of the first type, thereby revealing the surface of said second doped layer of the first type to form a source protruding body. The sidewalls of the source protruding body are then covered by an insulating layer. And finally, the field oxide layer and the insulating layer are then utilized as shielding masks for implanting impurities of the second type into the second doped layer of the first type, thereby forming the gate layer of the second type for the MOSFET.

BRIEF DESCRIPTION OF THE DRAWING

Other objects, features, and advantages of the present invention will become apparent by way of the following detailed description of the preferred but non-limiting embodiments. The description is made with reference to the accompanying drawings in which.

DETAILED DESCRIPTION OF THE PREFERRED EMBODIMENT

Refer to FIGS. 2a–2f for a description of the fabrication process of the present invention. FIGS. 2a–2f schematically show cross-sectional views of the MOSFET fabricated in accordance with a preferred embodiment as depicted in the selected process stages of fabrication.

The process for making high-voltage MOSFET semiconductor devices in accordance with the exemplified embodiment of the present invention is suitable for fabrication on a heavily-doped semiconductor substrate 20 of either the $P^+$- or $N^+$-type, although an $N^+$-type substrate is employed for the description of the present invention.

Step 1

Figure 1:
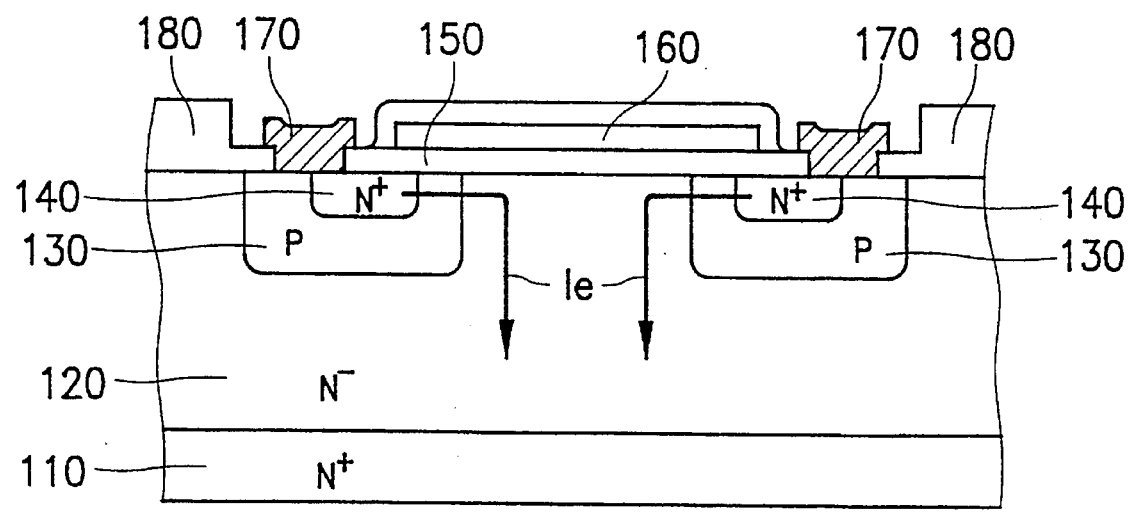
FIG. 1 schematically shows the cross-sectional view of a conventional MOSFET.
Figure 2A:
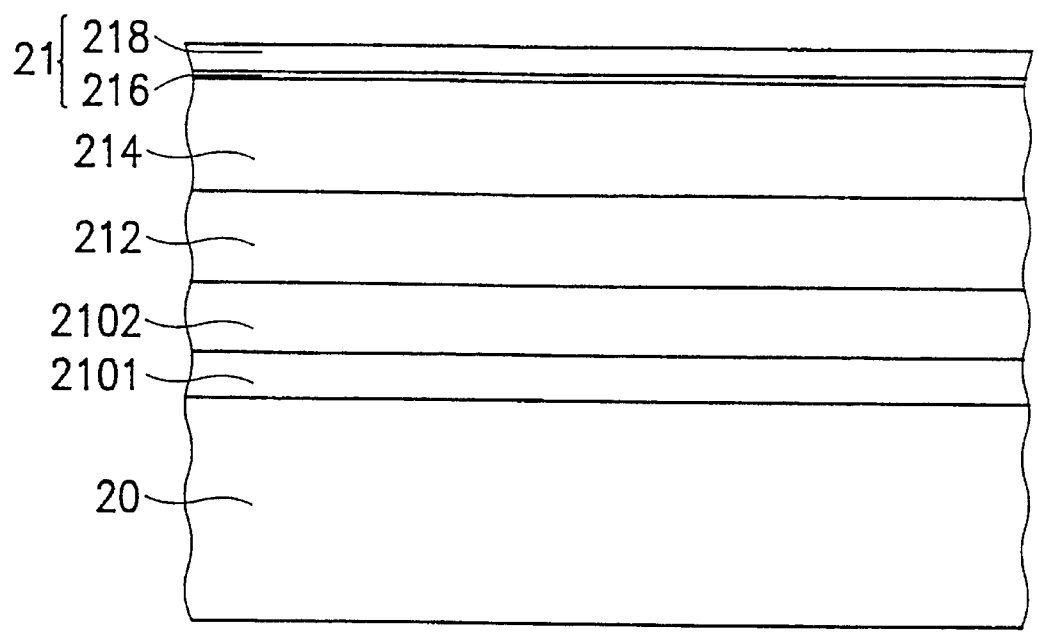
FIGS. 2a–2f schematically show the cross-sectional views of the MOSFET fabricated in accordance with a preferred embodiment of the present invention as depicted in selected process stages of fabrication.

First, as seen in FIG. 2a, at least one first doped layer 2101, or two of the first doped layers 2101 and 2102, a second doped layer 212, a third doped layer 214, and a shielding layer 21 are subsequently formed over the surface of the substrate 20 having been doped with impurities of the first conductivity type. There exist the relationships concerning the thickness and impurity concentration among the doped layers 2101, 2102, 212 and 214 that are formed over the surface of the substrate 20.

Let $n_1$, $n_2$ and $n_3$ denote the impurity concentrations, and let $d_1$, $d_2$ and $d_3$ denote the thickness of the doped layers consisting of 2101 and 2102, 212 and 214 respectively. The impurity concentration of the substrate 20 is denoted by n. The thickness and impurity concentration relationships are, respectively, $n > n_1 > n_2 > n_3$, and $d_3 \geq d_2 \geq d_1$. The two first doped layers 2101 and 2102, although generally denoted by a common thickness $d_1$ and impurity concentration $n_1$, may have different thicknesses and impurity concentrations if desired. However, the thickness of the upper layer 2102 should not be smaller than the lower layer 2101, and the impurity concentration of the upper layer 2102 should be smaller than that of the lower layer 2101.

For example, the N$^+$ substrate 20 may first be covered by growing the N-type first epitaxial layers 2101 and 2102, the N-type second epitaxial layer 212, and the N-type third epitaxial layer 214. The pad oxide layer 216 and the nitride layer 218 may then be formed further covering the N-type third epitaxial layer 214, thereby forming the shielding layer 21, as is shown in FIG. 2a.

Step 2

Figure 2B:
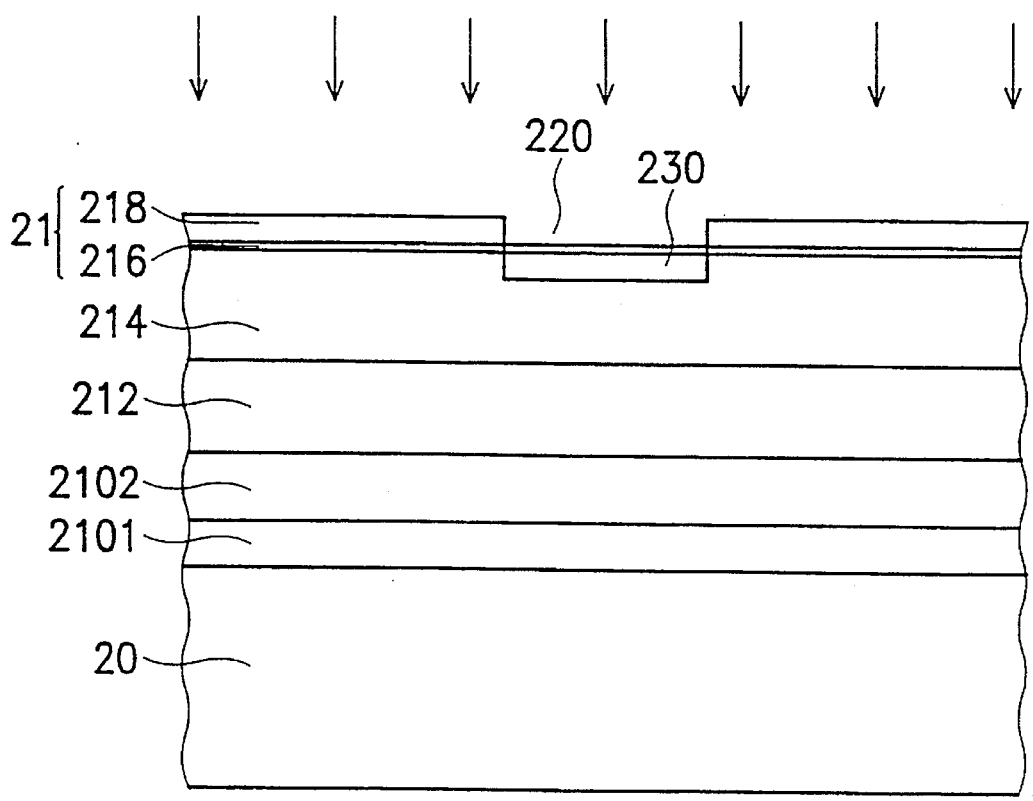

Refer next to FIG. 2b. An opening 220 in the shielding layer 21 is formed by removing the designated location in the layer to define the source region for the high-voltage MOSFET to be fabricated. The remaining portion of the shielding layer 21 is then utilized as the shielding mask for the implementation of a impurity implantation procedure, so as to implant impurities of the first conductivity type into the exposed area of the opening 220, reaching the desired depth of the third doped layer 214, as is schematically shown in the drawing, thereby forming the source region 230 for the MOSFET to be fabricated.

This process step can be achieved by, for example, applying a photolithography procedure to form the opening 220 in the shielding layer 21. With the opening 220 formed, a ion implantation procedure can then be employed to implant N-type impurities in the exposed N-type third epitaxially grown layer 214. The result is the formation of the N$^+$ source region 230.

Step 3

Figure 2C:
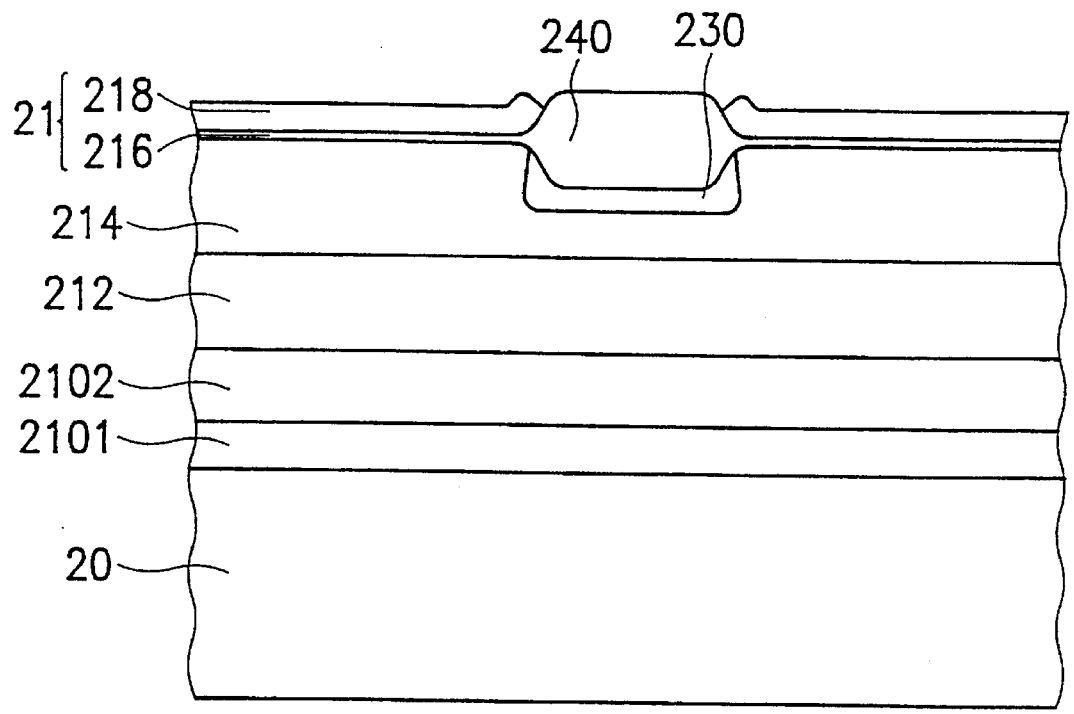

Next, as is seen in FIG. 2c, the shielding layer 21 is again employed as the shielding mask for the implementation of an oxidation process, so as to form a field oxide layer 240 over the surface of the source region 230.

This can be done by, for example, performing a thermal oxidation procedure, with the presence of the shielding layer 21 having an opening 220. The result of this thermal oxidation procedure is the formation of the field oxide layer 240 that covers the surface of the source region 230.

After the formation of the field oxide layer 240, the shielding layer 21 may then be removed.

Step 4

Figure 2D:
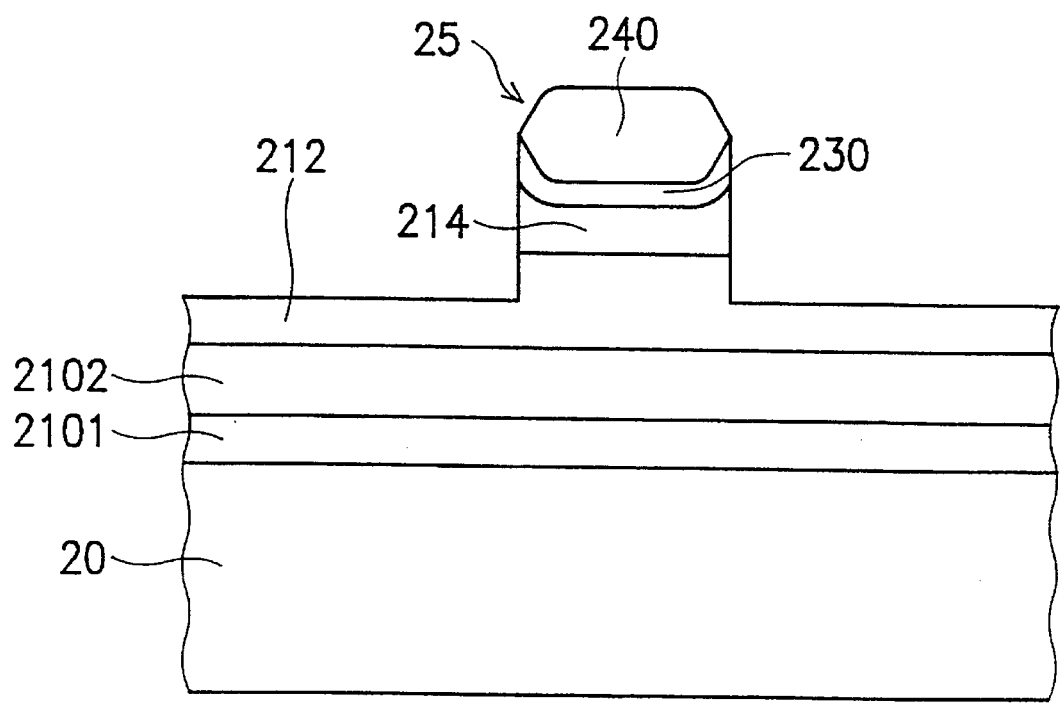

Refer next to FIG. 2d. The field oxide layer 240 is now employed as the shielding mask for the implementation of an etching procedure. The etching procedure removes a thickness of the entire structural configuration at this stage deep into the second doped layer 212. A portion of the thickness of the second doped layer 212 is etched away in this process, as is schematically shown in the drawing. The result of this controlled etching procedure is the formation of the protruded body 25.

To achieve the formation of the protruded body 25, for example, an etching procedure such as anisotropic etching may be employed at a controlled rate and time to remove the entire layer of the N-type third epitaxially grown layer 214, as well as a portion of the thickness of the N-type second epitaxially grown layer 212. Due to the anisotropic etching characteristics of the etching procedure, the protruded body 25 may be formed, protruding out of the surface of the semiconductor structural configuration at this stage.

Step 5

Figure 2E:
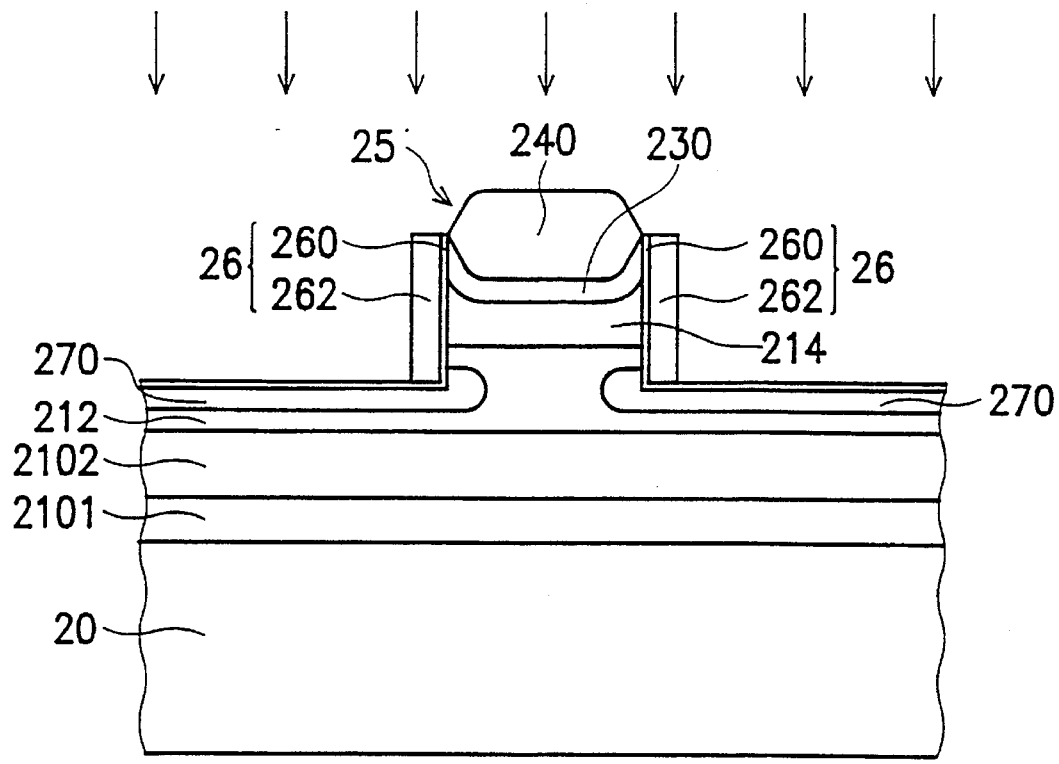

Then, as is seen in FIG. 2e, insulating layers 26 are formed over the exposed sidewall of the protruded body 25 which, together with the field oxide layer 240, may be utilized as the shielding mask for the implementation of another impurity implantation procedure. The implantation procedure is aimed at implanting impurities of the second conductivity type to the designated depth of the exposed second doped layer 212, thereby forming the gate region 270 of the second conductivity type.

This can be done by, for example, first performing a thermal oxidation procedure to grow a pad oxide layer 260 and followed by the deposition of a nitride layer 262. An etching procedure then follows to form the insulating layer 26 into shape. With the insulating layer 26 in place, an ion implantation procedure is then conducted to implant P-type impurities into the N-type second epitaxially grown layer 212, so as to form the P$^+$ implantation region 270 that is utilized as the gate region.

Step 6

Figure 2F:
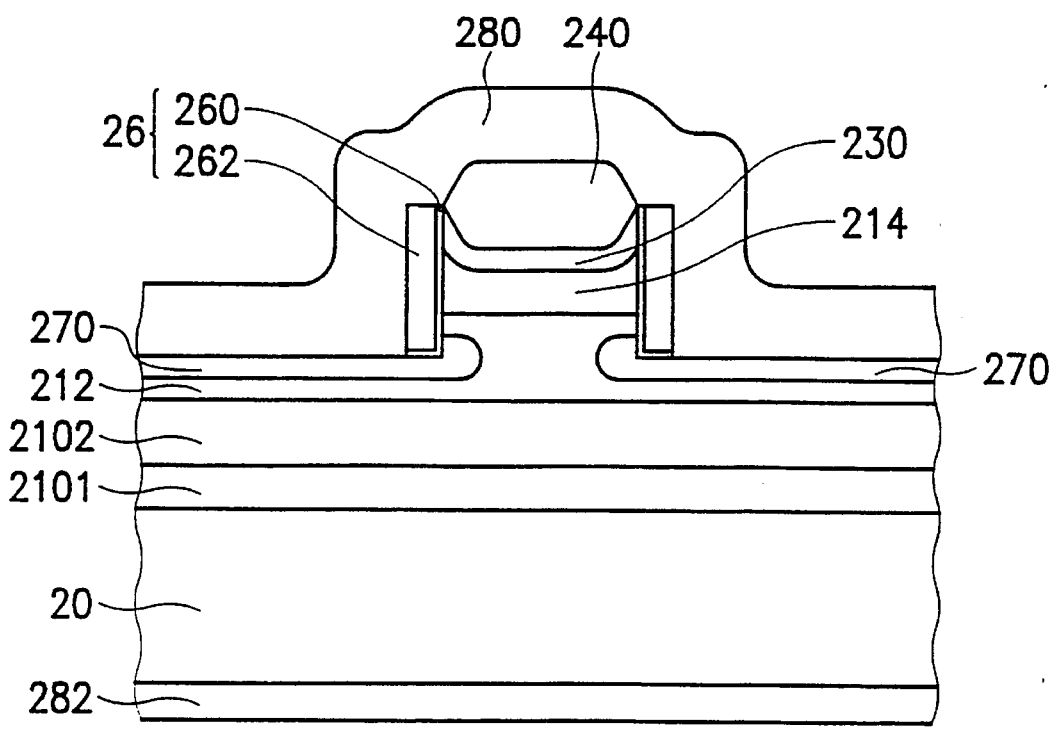

Finally, as in FIG. 2f, metal contact layers 280 and 282 are formed over the top and bottom surfaces of the semiconductor configuration.

Thus, with the MOSFET device fabricated over the semiconductor substrate as shown in FIG. 2f, due to the fact that the source region, the channel, the drift region and the drain region are in general all aligned in a direction vertical to the plane of the substrate of the MOSFET device in a stacking manner, the device surface area can be greatly reduced in comparison to conventional MOSFET devices. This is particularly suitable for the requirements of device miniaturization.

On the other hand, since the layers between the drain and source regions of the MOSFET device of the present invention are fabricated with decreasing impurity doping concentrations, the breakdown voltage of the entire MOSFET device may therefore be increased. A MOSFET device having increased breakdown voltage characteristics means that it can handle higher operating voltages.

What is claimed is:

1. A process for fabricating a high-voltage MOSFET device on a semiconductor substrate doped with impurities of a first conductivity type as the drain region for said MOSFET device, said process comprising:

subsequently forming a first doped layer of the first conductivity type on said substrate, a second doped layer of the first conductivity type on said first doped layer, a third doped layer of the first conductivity type on said second doped layer and a shielding layer on said third doped layer, wherein said second doped layer has an impurity concentration smaller than the impurity concentration of said first doped layer and a thickness larger than the thickness of said first doped layer, and larger impurity concentration than the third doped layer and a smaller thickness than said third doped layer, and wherein said impurity concentration of said first doped layer is smaller than the impurity concentration of said substrate;

forming an opening in said shielding layer;

forming the source region of said MOSFET device in said third doped layer in the area exposed by said opening;

performing a thermal oxidation process for forming a field oxide layer over said source region;

etching said third doped layer by using said field oxide layer as a first mask thereby exposing said second doped layer to form a source protruding body;

forming an insulating layer around the sidewalls of said source protruding body; and utilizing said field oxide layer and said insulating layer as a second mask for implanting impurities of a second conductivity type into said second doped layer, thereby forming the gate region for said MOSFET device.

2. The process as in claim 1, wherein said first doped layer of said first conductivity type further comprises an upper layer and a lower layer, said upper layer having an impurity concentration smaller than said lower layer and a thickness larger than said lower layer.

3. The process as in claim 1, further comprising the steps of forming the electrodes for said drain region, gate region and source region.

4. The process as in claim 1, wherein said first, second and third doped layers are epitaxially grown layers.

5. The process as in claim 1, wherein said insulating layer comprises an oxide layer and a nitride layer.

6. The process as in claim 1, wherein said first conductivity type is N-type and said second conductivity type is P-type.

7. The process as in claim 1, wherein said first conductivity type is P-type and said second conductivity type is N-type.

* * * * *